US008623456B2

(12) United States Patent
Yoon et al.

(10) Patent No.: US 8,623,456 B2
(45) Date of Patent: Jan. 7, 2014

(54) METHODS FOR ATOMIC LAYER DEPOSITION

(75) Inventors: Hyungsuk Alexander Yoon, San Jose, CA (US); Mikhail Korolik, San Jose, CA (US); Fritz C. Redeker, Fremont, CA (US); John M. Boyd, Woodlawn, OH (US); Yezdi Dordi, Palo Alto, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 13/605,926

(22) Filed: Sep. 6, 2012

(65) Prior Publication Data
US 2013/0040460 A1  Feb. 14, 2013

Related U.S. Application Data

(62) Division of application No. 11/736,511, filed on Apr. 17, 2007, now Pat. No. 8,287,647.

(51) Int. Cl.
C23C 16/22 (2006.01)
C23C 16/44 (2006.01)

(52) U.S. Cl.
USPC .............. 427/255.23; 427/255.31; 427/255.5; 427/569

(58) Field of Classification Search
USPC ................ 427/248.1, 255.23, 255.28, 569, 427/255.31, 255.5
See application file for complete search history.

(56) References Cited

U.S. PATENT DOCUMENTS

| 2003/0003730 A1* | 1/2003 | Li ................................. 438/680 |
| 2003/0104126 A1* | 6/2003 | Fang et al. ............. 427/255.392 |
| 2003/0190423 A1* | 10/2003 | Yang et al. ............... 427/255.28 |
| 2003/0215570 A1* | 11/2003 | Seutter et al. .......... 427/255.394 |
| 2005/0271814 A1* | 12/2005 | Chang et al. ................ 427/248.1 |
| 2006/0073276 A1* | 4/2006 | Antonissen ................ 427/248.1 |
| 2007/0015374 A1* | 1/2007 | Granneman .................. 438/758 |
| 2007/0224348 A1* | 9/2007 | Dickey et al. .............. 427/248.1 |

OTHER PUBLICATIONS

Puurunen, Riikka, "Surface chemistry of atomic layer deposition: A case study for the trimethylaluminum/water process". Journal of Applied Physics 97, 121301 (2005), pp. 1-52.*
Kim, H., et al., "Atomic layer deposition of metal and nitride thin films: Current research efforts and applications for semiconductor device processing." J. Vac. Sci. Technol. B 21(6), Nov./Dec. 2003, pp. 2231-2261.*
Leskela, Markku, et al., "Atomic layer deposition (ALD): from precursors to thin film structures". Thin Solid Films 409 (2002), 138-146.*

* cited by examiner

Primary Examiner — Bret Chen
(74) Attorney, Agent, or Firm — Martine Penilla Group, LLP

(57) ABSTRACT

A method of depositing a thin film by atomic layer deposition (ALD) on a substrate surface is disclosed. The disclosed method includes placing an ALD deposition proximity head above the substrate with at least one gas channel configured to dispense a gas to an active process region of the substrate surface. The ALD deposition proximity head extends over and is being spaced apart from the active process region of the substrate surface when present. After a pulse of a first reactant gas is dispensed on the active process region of the substrate surface underneath the proximity head, a pulse of a second reactant gas is dispensed on the active process region of the substrate surface underneath the proximity head to react with the first reactant gas to form a portion of the thin layer of ALD film on the surface of substrate underneath the proximity head.

11 Claims, 14 Drawing Sheets

METHODS FOR ATOMIC LAYER DEPOSITION

CLAIM OF PRIORITY

This application is a divisional application and claims priority under 35 U.S.C. §120 to U.S. patent application Ser. No. 11/736,511, filed on Apr. 17, 2007, now U.S. Pat. No. 8,287, 647, the contents of which is incorporated herein by reference.

CROSS REFERENCE TO RELATED APPLICATION

This application is related to U.S. patent application Ser. No. 11/736,514, entitled "Apparatus and Method for Pre and Post Treatment of Atomic Layer Deposition," U.S. patent application Ser. No. 11/736,519, entitled "Apparatus and Method for Integrated Surface Treatment and Film Deposition," and U.S. patent application Ser. No. 11/736,522, entitled "Apparatus and Method for Integrated Surface Treatment and Deposition for Copper Interconnect," all of which are filed on the same day as the instant application. The disclosure of these related applications is incorporated herein by reference in their entireties for all purposes.

This application is also related to U.S. patent application Ser. No. 11/173,729, entitled "A Method and Apparatus for Atomic Layer Deposition (ALD) in a Proximity System" filed on Jun. 30, 2005, which is incorporated herein by reference in its entirety.

BACKGROUND

In the fabrication of semiconductor devices such as integrated circuits, memory cells, and the like, a series of manufacturing operations are performed to define features on semiconductor wafers. The semiconductor wafers include integrated circuit devices in the form of multi-level structures defined on a silicon substrate. At a substrate level, transistor devices with diffusion regions are formed. In subsequent levels, interconnect metallization lines are patterned and electrically connected to the transistor devices to define a desired integrated circuit device. Also, patterned conductive layers are insulated from other conductive layers by dielectric materials.

Reliably producing sub-micron and smaller features is one of the key technologies for the next generation of very large scale integration (VLSI) and ultra large scale integration (ULSI) of semiconductor devices. However, the shrinking dimensions of interconnect in VLSI and ULSI technologies have placed additional demands on the processing capabilities. As circuit densities increase, the widths of vias, contacts and other features, as well as the dielectric materials between them, decrease to sub-micron dimensions (e.g., less than 0.10 micrometers or less), whereas the thickness of the dielectric layers remains substantially constant, with the result that the aspect ratios for the features, i.e., their height divided by width, increase. Many traditional deposition processes have difficulty achieving substantially void-free and seam-free filling of sub-micron structures where the aspect ratio exceeds 4:1.

Currently, copper and its alloys have become the metals of choice for sub-micron interconnect technology due to its lower resistivity. One problem with the use of copper is that copper diffuses into silicon, silicon dioxide, and other dielectric materials, which may compromise the integrity of devices. Conformal barrier layers can be used to prevent copper diffusion. Copper might not adhere well to the barrier layer; therefore, a liner layer might need to be deposited between the barrier layer and copper. Conformal deposition of the barrier layer and liner layer is important to provide good step coverage to assist copper adhesion and/or deposition.

In view of the foregoing, there is a need for apparatus and methods of depositing conformal thin film in interconnect structures.

SUMMARY

Broadly speaking, the embodiments fill the need for apparatus and methods of depositing conformal thin film in interconnect structures by providing processes and systems using an atomic layer deposition (ALD). More specifically, each of the ALD systems includes a proximity head that has a small reaction volume right above a portion of the substrate. The proximity head dispenses small amount of reactants and purging gas to be distributed and pumped away from the small reaction volume between the proximity head and the substrate in relatively short periods, which increases the throughput.

It should be appreciated that the present invention can be implemented in numerous ways, including as a solution, a method, a process, an apparatus, or a system. Several inventive embodiments of the present invention are described below.

In one embodiment, an apparatus for depositing a thin film by atomic layer deposition (ALD) is provided. The apparatus includes a substrate support configured to support a substrate. The apparatus also includes a proximity head configured to sequentially dispense a reactant gas and a purging gas to deposit a thin ALD film under the proximity head. The proximity head covers an active process region of a substrate surface. The proximity head also includes at least one vacuum channel to pull excess reactant gas, purging gas, or deposition byproducts from a reaction volume between a surface of the proximity head facing the substrate and the substrate.

In another embodiment, a proximity head for dispensing reactants and purging gas to deposit a thin film by atomic layer deposition (ALD) is provided. The proximity head is configured to sequentially dispensing a reactant gas and a purging gas to deposit a thin ALD film under the proximity head. The proximity head covers an active process region of a substrate surface. The proximity head also includes at least one vacuum channel to pull excess reactant gas, purging gas, or deposition byproducts from a reaction volume between a surface of the proximity head facing the substrate and the substrate. The proximity includes a plurality of sides, each side being configured to dispense either a reactant gas or a purging gas on the substrate surface underneath the proximity head. Each side has at least one vacuum channel.

In yet another embodiment, a method of depositing a thin film by atomic layer deposition (ALD) on a substrate surface of a substrate is provided. The method includes placing an ALD deposition proximity head above the substrate with at least one gas channel configured to dispense a first reactant gas to an active process region of the substrate surface. The ALD deposition proximity head covers the active process region of the substrate surface. The method also includes dispensing a pulse of a first reactant gas on the active process region of the substrate surface underneath the first side of the proximity head. The method further includes dispensing a first pulse of purging gas on the active process region of the substrate surface underneath the proximity head to purge excess first reactant gas from a reaction volume between the ALD proximity head and the substrate surface.

In addition, the method includes dispensing a pulse of a second reactant gas on active process region of the substrate surface underneath the proximity head to react with the first reactant gas to form a portion of the thin layer of ALD film on the surface of substrate underneath the proximity head. Additionally, the method includes dispensing a second pulse of purging gas on the active process region of the substrate surface underneath the proximity head to remove excess second reactant gas and reaction byproduct(s) of forming the portion of the thin layer of ALD from the reaction volume between the ALD proximity head and the substrate surface.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE EXEMPLARY EMBODIMENTS

Several exemplary embodiments of ALD apparatus and methods using proximity heads are provided. The proximity head ALD apparatus and methods improve ALD processing throughput and allow integration with pre and post treatment for ALD deposition in the same apparatus. It should be appreciated that the present invention can be implemented in numerous ways, including a process, a method, an apparatus, or a system. Several inventive embodiments of the present invention are described below. It will be apparent to those skilled in the art that the present invention may be practiced without some or all of the specific details set forth herein.

Figure 1A:
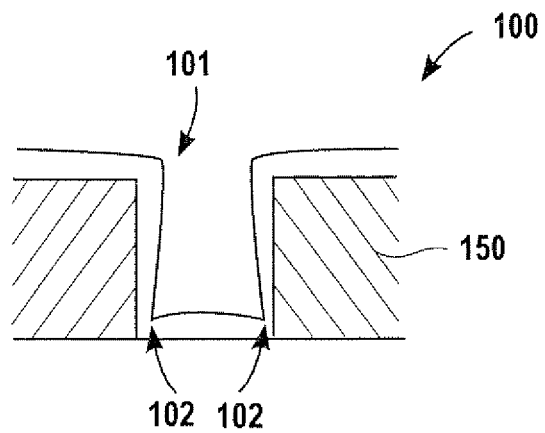
FIG. 1A shows an interconnect structure deposited with a barrier layer.

Barrier overhang 101 near top of the interconnect structure 100, as shown in FIG. 1A, by conventional physical vapor deposition (PVD) process is known to cause copper voids in metal lines or vias during copper gap-fill due to poor step coverage. The limited deposition of barrier material in the lower corners 102, as shown in FIG. 1A, is also a known problem to cause copper diffusion, electro-migration (EM) problem, and stress-induced voiding. To ensure sufficient barrier material in the lower corners, sufficient barrier materials need to be deposited in the interconnect structures. Therefore, a more conformal barrier deposition is needed. The barrier layer 101 can be made of refractory metal compound, such as tantalum nitride (TaN), tantalum (Ta), or a combination of these films. Other barrier layer materials can also be used. Barrier layer materials may be other refractory metal compound including but not limited to titanium (Ti), titanium nitride (TiN), tungsten (W), zirconium (Zr), hafnium (Hf), molybdenum (Mo), niobium (Nb), vanadium (V), ruthenium (Ru) and chromium (Cr), among others.

Figure 1B:
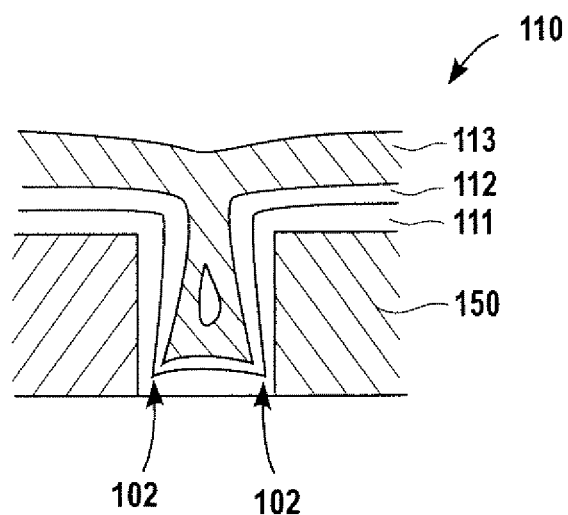
FIG. 1B shows an interconnect structure deposited with a barrier layer, a liner layer and a copper layer.

In addition to step coverage concern, barrier layer, such as tantalum nitride (TaN), adheres well to dielectric layer 150; however, the adhesion between TaN and copper is poor. In contrast, barrier layer, such as tantalum (Ta), adheres well to copper, but not as well to the dielectric layer. It's possible to deposit a TaN layer 111 to line the interconnect structure 110 to allow the TaN to contact the dielectric material 150 and to deposit a Ta layer afterwards for copper 113 to be in contact with Ta 112, as shown in FIG. 1B. The Ta layer acts as a liner layer or a glue layer to copper. However, a two-step process is more complicated and the deposition of the first TaN makes the aspect ratio of the interconnect structure even higher, which worsen the step coverage issue of the following Ta layer. Other examples of liner layer include, not limited to, titanium (Ti), titanium nitride (TiN), and ruthenium (Ru), among others.

Figure 2:
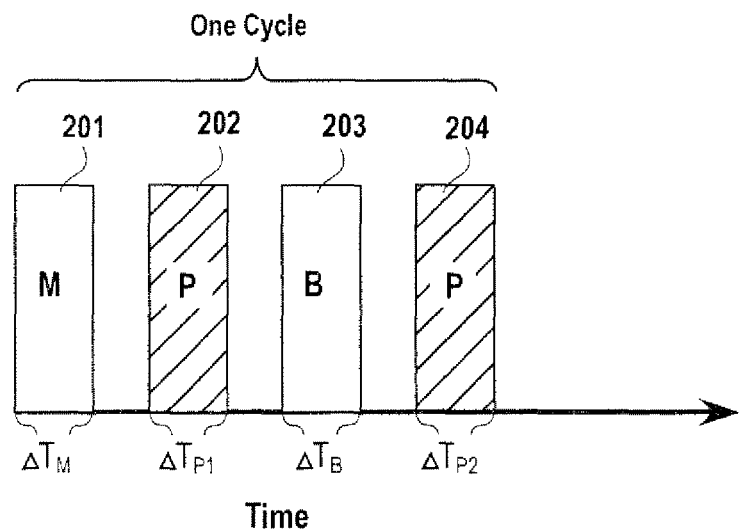
FIG. 2 shows an exemplary ALD deposition cycle.

Atomic layer deposition (ALD) is known to produce thin film with good step coverage. ALD is typically accomplished by using multiple pulses, such as two pulses, of reactants with purge in between, as shown in FIG. 2. For metallic barrier deposition, a pulse of barrier-metal-containing reactant (M) 201 is delivered to the substrate surface, followed by a pulse of purging gas (P) 202. Examples of barrier-metal-containing reactant for barrier metal such as tantalum nitride include but are not limited to pentaethylmethylamino-tantalum (PEMAT; $Ta(NC_2H_5CH_3)_5$), pentadiethylamino-tantalum (PDEAT, $Ta[N(C_2H_5)_2]_5$), pentadimethylamino-tantalum (PDMAT, $Ta[N(CH_3)_2]_5$), and any and all of derivatives of PEMAT, PDEAT, or PDMAT. Other tantalum containing precursors include without limitation tertbutylimido-tris(diethylamido)-tantalum (TBTDET), tertbutylimido-tris(dimethylamido)-tantalum (TBTDMT), and tertbutylimido-tris(ethylmethylamido)-tantalum (TBTEMT), and all of derivatives of TBTDET, TBTDMT, and TBTEMT. Additionally, other tantalum containing precursors include without limitation tantalum halides for example $TaX_5$ where X is fluorine (F), bromine (Br) or chlorine (Cl), and derivatives thereof. Examples of purging gas include helium (He), neon (Ne), argon (Ar), hydrogen ($H_2$), nitrogen ($N_2$), and combinations thereof.

The pulse of barrier-metal-containing reactant 201 delivered to the substrate surface form a monolayer of barrier metal, such as Ta, on the substrate surface. In one embodiment, the pulse of purging gas is a plasma enhanced (or plasma assisted) gas. The barrier metal, such as Ta, bonds to the substrate surface, which is made of dielectric material. The purge gas 202 removes the excess barrier-metal-containing reactant 201 from the substrate surface. Following the pulse of the purging gas 202, a pulse of reactant (B) 203 is delivered to the substrate surface. The reactant (B) 203 can be nitrogen-containing gas or a hydrogen-containing reducing gas. If the barrier material contains nitrogen, such as TaN, the reactant (B) 203 is likely to contain nitrogen. Examples of reactant (B) 203 include ammonia ($NH_3$), $N_2$, and NO. Other N-containing precursors gases may be used including but not limited to $N_xH_y$ for x and y integers (e.g., $N_2H_4$), $N_2$ plasma source, $NH_2N(CH_3)_2$, among others. If the barrier material contains little or no nitrogen, the reactant (B) 203 can be a hydrogen-containing reducing gas, such as $H_2$. Following pulse 203 is a pulse of purging gas 204. Reactants M, B, and purge gas can be plasma enhanced or thermally excited. In one embodiment, the pulse of reactant (B) 203 is a plasma-enhanced (or plasma-assisted).

The tantalum nitride layer formation may start with the chemisorption of a monolayer of a tantalum-containing compound on the substrate followed by a monolayer of a nitrogen-containing compound. Alternatively, the tantalum nitride layer formation may start with the chemisorption of a monolayer of a nitrogen-containing compound on the substrate followed by a monolayer of the tantalum-containing compound. Furthermore, in an alternative embodiment, a pump evacuation alone between pulses of reactant gases may be used to prevent mixing of the reactant gases.

FIG. 2 shows one cycle of the barrier deposition pulses. After one cycle of the barrier deposition pulses, a thin layer (or phase) of barrier layer or liner layer is deposited. One or more cycles of pulses are applied until desired barrier layer thickness is achieved. The duration of the pulses is between about 100 mili-seconds to about 2 seconds. The thickness of the barrier layer and/or liner layer is between about 10 Å to about 50 Å, preferably between about 20 Å to about 30 Å.

In conventional ALD apparatus and process, reactive gas(es) and purging gas(es) are introduced across the entire substrate surface. It requires a certain amount of time $\Delta T_M$, $\Delta T_B$ for reactant M or B to cover the entire substrate surface. Similarly, in order to ensure that excess reactant M or B is pumped away from the substrate surface, sufficient purging time $\Delta T_{P1}$, $\Delta T_{P2}$ is required, as shown in FIG. 2. $\Delta T_M$, $\Delta T_B$, $\Delta T_{P1}$, and $\Delta T_{P2}$ can also be called the pulse times (or durations) for reactant M, purging gas for reactant M, reactant B and purging gas for reactant B, respectively. The pulse times for reactant M, purging gas for reactant M, reactant B, and purging gas for reactant B affect barrier layer deposition throughput. Reactant B is introduced into the process chamber or to the substrate surface after the substrate surface and process chamber is substantially free of reactant M. Similarly, reactant M is introduced into the process chamber or to the substrate surface after the substrate surface and process chamber is substantially free of reactant B.

Figure 3:
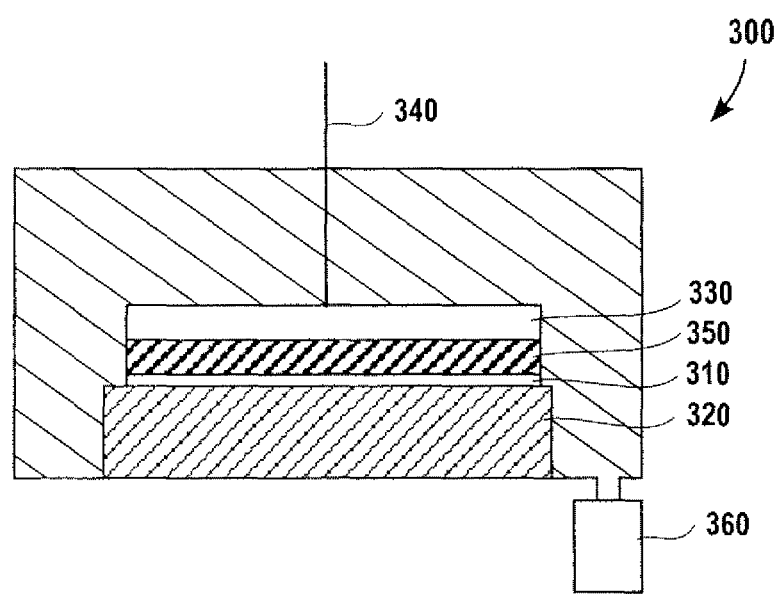
FIG. 3 shows a schematic diagram of an exemplary and conventional ALD chamber.

FIG. 3 shows a process chamber 300 with a substrate 310 disposed on substrate support 320. In process chamber 300, there is a showerhead 330 suspended above substrate 310. A gas inlet 340 is coupled to the showerhead 330. A pump 360 is connected to the process chamber 300. Pump 360 pumps gas(es) in the reaction chamber 300 out of the reaction chamber and maintains the pressure in the chamber. Between the shower head 330 and the substrate 310 is a reaction volume 350. During the purging periods, the excess reactant M or B on the substrate surface needs to be purged from the substrate surface. It is also desirable to purge the excess reactant M or B from the rest of the process chamber to prevent reactants M and B from mixing to prevent particle problem. As discussed above, purging can be replaced by pumping, in some embodiments. To purging excess reactant M or B from the entire substrate surface and/or the process chamber can be time-consuming.

Due to the lengths of the pulses, the deposition cycle can be long and the deposition rate can be relatively low. For example, typical deposition cycle for conventional ALD process chamber is about 1-5 sec/cycle. Typical film thickness per cycle is about 1 Å/cycle for $Al_2O_3$, about 2.5 Å/cycle for W, between about 0.4 Å/cycle to about 2.6 Å/cycle for TaN, and about 0.4 Å/cycle for Ru. For Ru, the deposition rate is 0.08-0.4 Å/s, which is relatively low. As discussed above, Ru can be a barrier layer and also can be a liner layer.

Figure 4:
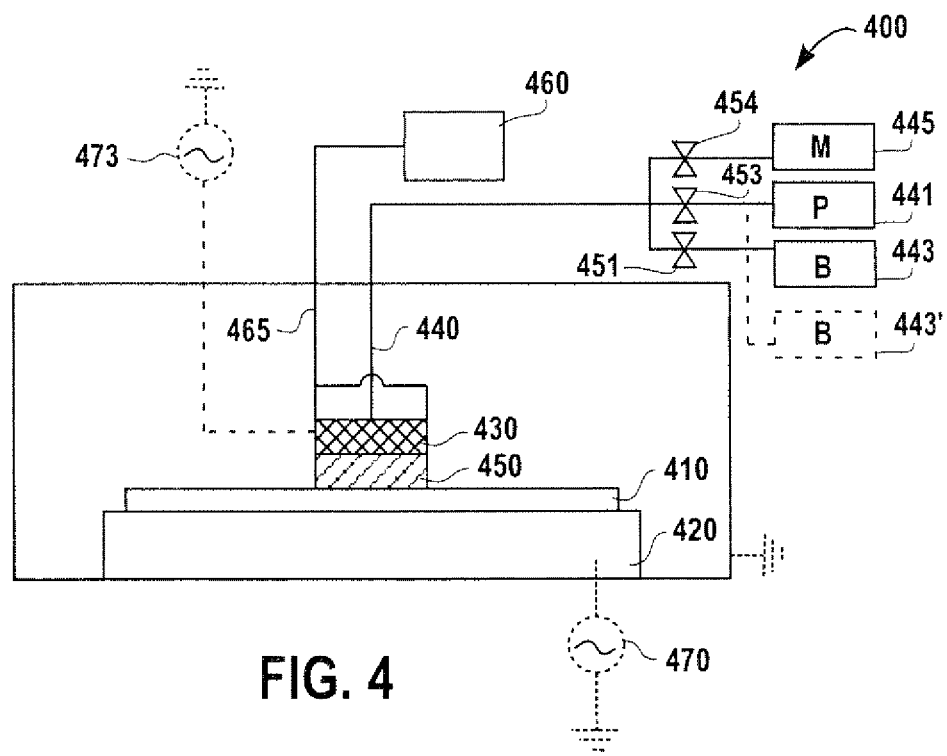
FIG. 4 shows a schematic diagram of an ALD chamber with a proximity head, in accordance with an embodiment of the current invention.

Due to the relatively long deposition cycle, the deposition rate (or through put) for some barrier or liner layers, such as Ru, is considered too low from manufacturing standpoint. In order to improve the deposition rate, the deposition cycle needs to be reduced. One way to reduce deposition cycle is to have short pulses of reactants and purging gases (fast purge or fast pump). Short pulses are possible if the reaction volume is small and when vacuuming (or pumping) of reactant or purging gas is near the reaction volume. FIG. 4 shows a schematic diagram of an ALD reactor 400 with a proximity head 430. In reactor 400, there is a substrate 410 disposed on a substrate support 420. The proximity head 430 is supported above substrate 410. Between the proximity head 430 and the substrate 410, there is a reaction volume 450.

A gas inlet 440 and a vacuum line 465 are coupled to the proximity head 430. The gas inlet 440 supplies reactants and purging gas to process chamber 400. The gas inlet 440 can be coupled to a plurality of containers that store reactants or purging gas. For example, the gas inlet 440 can be coupled to a container 441 that stores a first reactant, such as reactant M described in FIG. 2. In one embodiment reactant in container 441 is in liquid form and is carried into the gas inlet 440 by a carrier gas, which is one of the inert gases or a gas that does not react with reactant M, such as $N_2$. Examples of inert gas include helium, argon, neon, krypton, xenon, and radon. The gas inlet 440 can also be coupled to a container 443 that supplies a second reactant, such as reactant B described in FIG. 2. As described above, reactant B can be plasma assisted.

In one embodiment, reactant B is supplied by a reactor 443' that generate plasmarized reactant B. Alternatively, the substrate support 420 can be coupled to a radio frequency (RF) generator 470 to generate plasma to plasmarize reactant B when reactant B is dispensed into the reaction volume 450, instead of supplying plasmarized reactant B from reactor 443'. Another alternative is to couple an RF generator 473 to the proximity head 430 to generate plasma. In one embodiment, one electrode is coupled to the RF generator while the other electrode is grounded during plasma generation.

The gas inlet 440 can also be coupled to a container 441 that stores a purging gas. Purging gas and reactant B can also be diluted by a carrier gas, as described above for reactant M. Carrier gas can be used to sustain chamber pressure. Most likely reactant M needs a carrier gas, because it was in liquid form in storage tank. It needs carrier gas to bring the vaporized reactant M into the processing chamber. Reactant B (a reduction gas) might not need carrier gas, since it already is in gas form. However, reactant B might need a carrier gas to maintain the chamber pressure or to keep the concentration low.

There could be a heater (not shown) and/or a cooler coupled to, or embedded in, the substrate support 420 to maintain the substrate temperature. Other parts of the chamber could also be heated or cooled to maintain process temperature.

During ALD deposition cycles, one of reactants M, B and purging gas P is supplied to the gas inlet 440. The on and off of gas supplies of these gas are controlled by valves 451, 453, and 454. The other end of the vacuum line 465 is a vacuum pump 460. The reaction volume 450 in FIG. 4 is much smaller than the reaction volume 350 in FIG. 3. There is also a vacuum pump (not shown) coupled to the pressure chamber to maintain the chamber pressure.

Figure 5A:
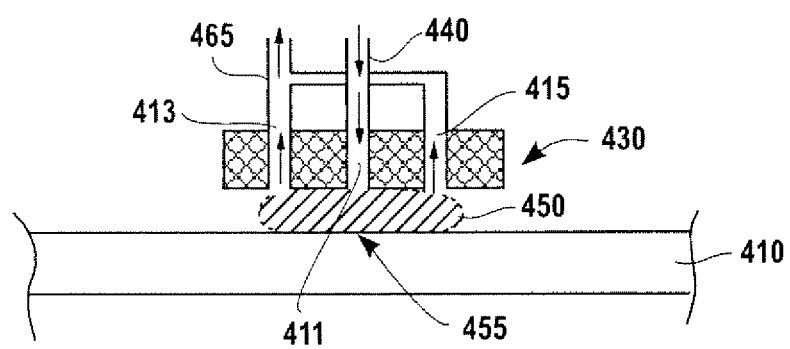
FIG. 5A shows a schematic diagram of a proximity head for ALD, in accordance with an embodiment of the current invention.

FIG. 5A shows one embodiment of a proximity head 430 disposed above substrate 410, with a reaction volume 450 between the proximity head 430 and substrate 410. The substrate surface under the reaction volume 450 is an active process region 455. The proximity head 430 has one or more gas channels 411 that supplies reactant M, B, or purging gas P. On both sides of the gas channel 411, there are vacuum channels 413, 415 pumping excessive reactants M, B, purging gas, and/or reaction byproducts from the reaction volume 450. Due to the existence of vacuum channels 413, 415 vacuuming excessive reactants or reactant byproducts away from substrate surface, purging gas might not be needed. Purging steps 202 and 204 in FIG. 2 might be eliminated in some embodiments.

Reactant M, B, and purging gas P is passed through the gas channel 411 sequentially, such as the sequence shown in FIG. 2. Gas channel 411 is coupled to gas inlet 440, which is coupled to different gas sources, including reactant M, B and purging gas P. When a pulse of gas, either reactant M, B, or P, is injected from the gas channel 411 to the substrate surface, the excess amount of gas is pumped away from the substrate surface by the vacuum channels 413, 415, which keeps the reaction volume small and reduces the purging or pumping time. Since the reaction volume is small, only small amount of reactant is needed to cover the small reaction volume. Similarly only small amount of purging gas is needed to purge the excess reactant from the reaction volume 450. In addition, the vacuum channels are right near the small reaction volume 450, which assists the pumping and purging of the excess reactants, purging gas, and reaction byproducts from the substrate surface. As a consequence, the pulse times $\Delta T_M$, $\Delta T_B$, $\Delta T_{P1}$, and $\Delta T_{P2}$ for reactants M, B, and purging gas respectively, can be greatly reduced. As a consequence, the cycle time can be reduced and the throughput can be increased.

Figure 5B:
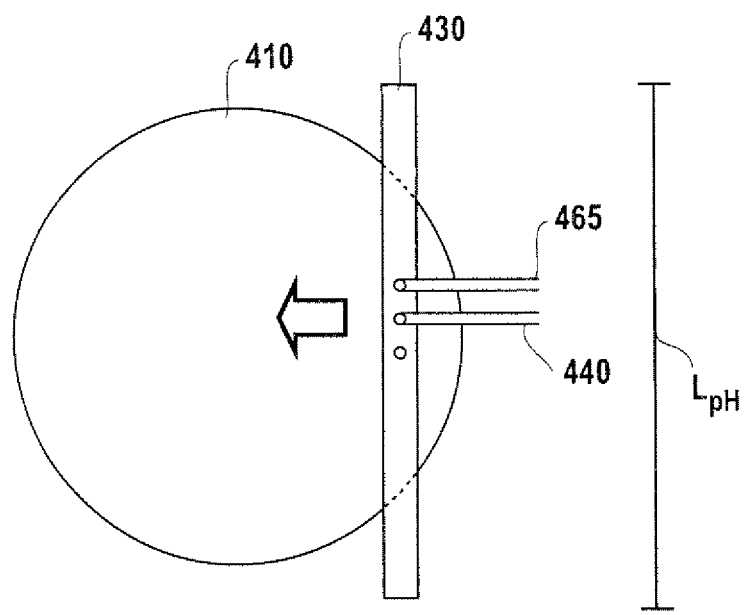
FIG. 5B shows a top view of a proximity head for ALD over a substrate, in accordance with an embodiment of the current invention.

FIG. 5B shows a schematic top view of an embodiment of proximity head 430 of FIG. 4 and FIG. 5A on top of a substrate 410. Proximity head 430 moves across the substrate surface. In this embodiment, the length of the proximity head $L_{PH}$ is equal to or greater than the diameter of the substrate. The reaction volume under the proximity head covers the substrate surface underneath. By moving the proximity head across the substrate once, the entire substrate surface is deposited with a thin film of the barrier or liner layer. In another embodiment, the substrate 410 is moved under the proximity head 430. In yet another embodiment, both the proximity head 430 and the substrate 410 move, but in opposite directions to cross each other. The thickness of the thin film deposited can be controlled by the speed the proximity head 430 move across the substrate 410.

Figure 5C:
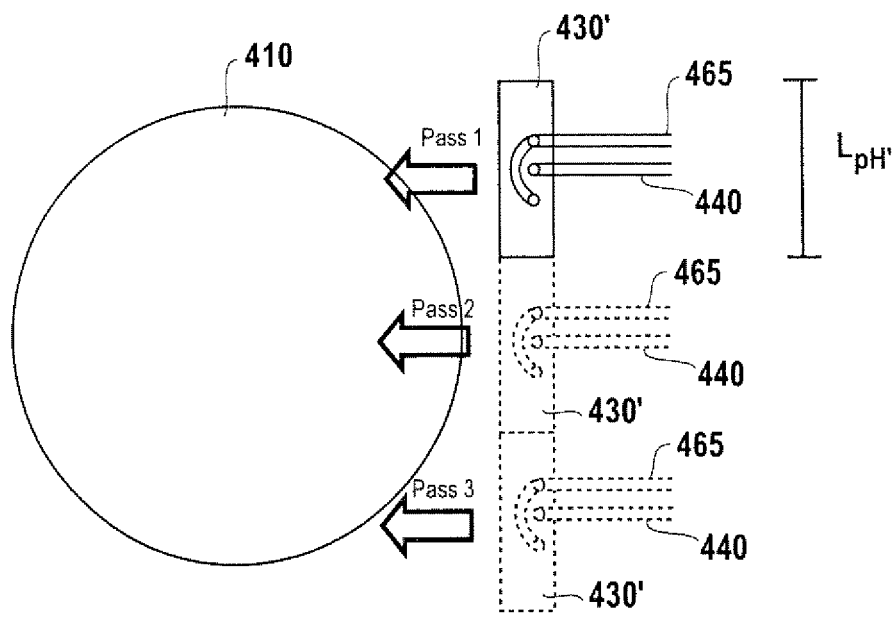
FIG. 5C shows a top view of a proximity head for ALD over a substrate, in accordance with another embodiment of the current invention.

Alternatively, the length of the proximity head $L_{PH}$ can be shorter than the diameter of the substrate. Multiple passes of the proximity head 430' across the substrate is needed to deposit a thin barrier or liner layer on the substrate surface. FIG. 5C shows a proximity head 430' with the length of the proximity head $L_{PH'}$ shorter than the diameter of the substrate. After the proximity head 430' move across the substrate surface in pass 1, the proximity head 430' can move downward to move across the substrate in pass 2 and pass 3. At the end of pass 3, the entire substrate surface is deposited with a thin layer of the barrier or liner film.

Figure 5D:
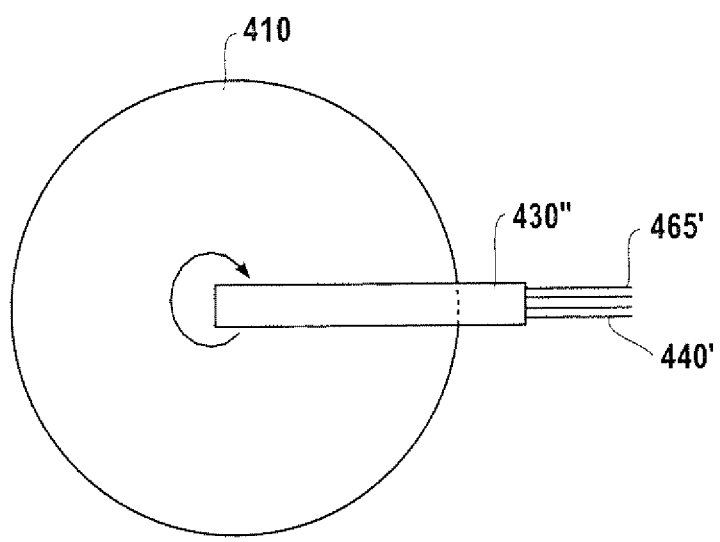
FIG. 5D shows a top view of a proximity head for surface treatment over a substrate, in accordance with yet another embodiment of the current invention.

FIG. 5D shows another embodiment with a proximity head 430" rotating around the surface of substrate 410. In this embodiment, the treatment gas is supplied to a gas inlet 440' that is attached to the end of the proximity head 430". The vacuum line 465' is also coupled to the end of the proximity head 430".

Figure 5E:
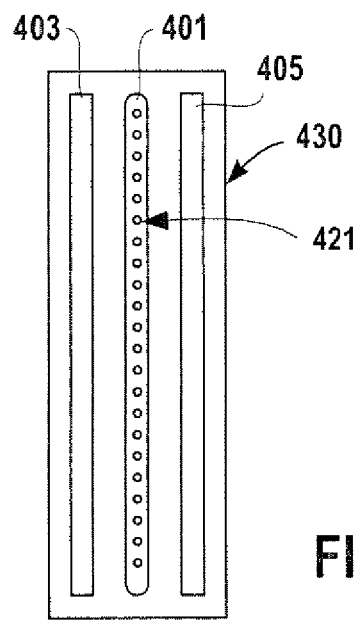
FIG. 5E shows a bottom view of a proximity head for ALD, in accordance with an embodiment of the current invention.
Figure 5F:
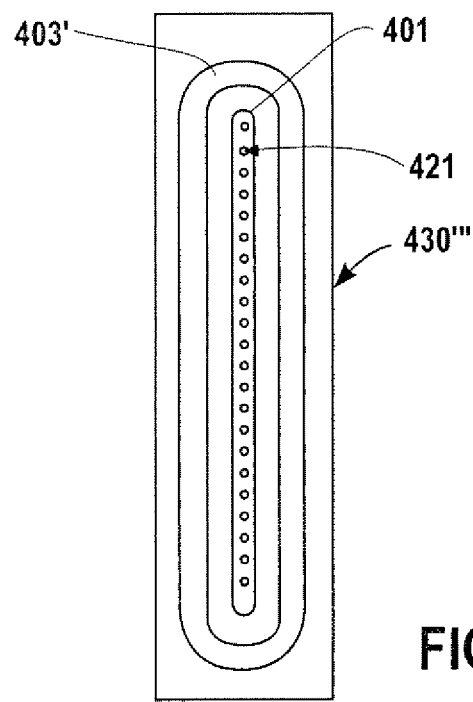
FIG. 5F shows a bottom view of a proximity head for ALD, in accordance with another embodiment of the current invention.

FIG. 5E show an embodiment of a bottom view of the proximity head 430 of FIG. 5A. The proximity head 430 has a gas injection head 401, coupled to gas channel 411 with a plurality of gas injection holes 421. The arrangement and shapes of gas injection holes 421 shown in FIG. 5E are merely examples. Other arrangement of injection holes and shapes of injection holes can also be used. In one embodiment, the injection head 401 has only one narrow slit (not shown), not injection holes. Alternatively, For example, there could be two or more rows of injection holes, instead of one. The injection holes can be staggered or can be side by side. The shapes of the injection holes can be round, square, hexagonal, or other shapes. The proximity head 430 also has vacuum heads 403, 405, coupled to the vacuum channels 413, 415 on both sides of the gas injection head 401. In this embodiment, vacuum heads, 403, 405 are two slits. Other shapes of geometries of vacuum heads can also be used. Alternatively, the slits of vacuum heads 403 and 405 are connected to become one single slit 403' surrounding the gas injection head 401, as shown in the proximity head 430''' in FIG. 5F.

Figure 5G:
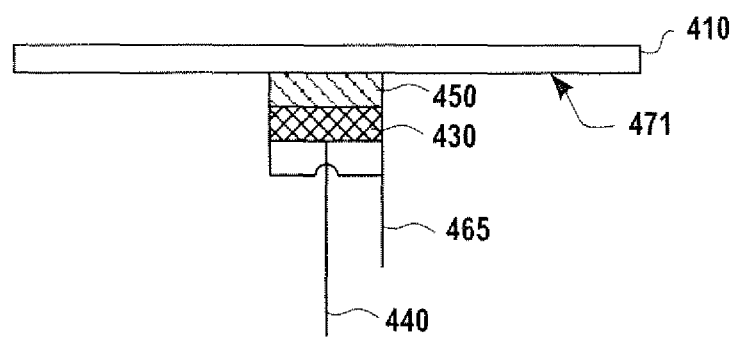
FIG. 5G shows a schematic cross-sectional view of a proximity head for ALD below a substrate, in accordance with one embodiment of the current invention.

In addition to placing a substrate under a proximity head, a substrate can also be placed above a proximity head to treat the substrate surface. FIG. 5G shows a schematic drawing of a proximity head 430 placed below a substrate 410, with an active surface 470 of the substrate 410 facing the proximity head 430. Devices are manufactured on the active surface 470. The substrate 410 is supported above the proximity head 430 by a device (not shown). The proximity head 430 is also supported by a mechanical device (not shown).

Figure 6A:
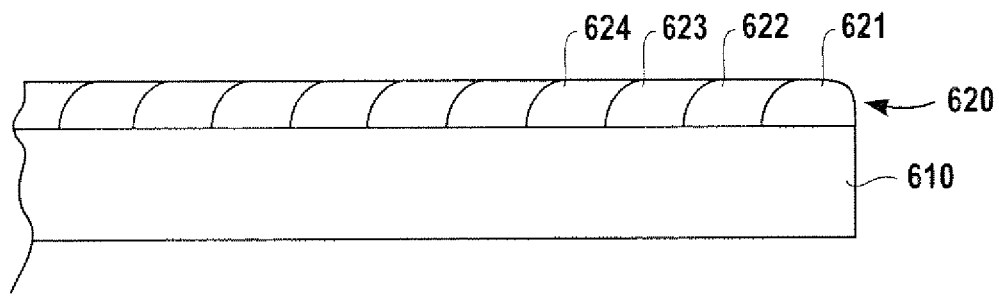
FIG. 6A shows a schematic diagram of a thin film deposited by a proximity head for ALD, in accordance with an embodiment of the current invention.

FIG. 6A shows a schematic cross-sectional diagram of a thin barrier or liner layer 620 deposited on a substrate 610. At the edge of substrate 610, a small section 621 of thin barrier or liner layer 620 is deposited under the proximity head. After section 621 is deposited, the proximity head is moved towards left to deposit another section 622, which overlaps section 621 slightly. Section 623 follows section 622, and section 624 follows section 623, and so on. At the other edge of the substrate, the deposition process stops and a complete thin film 620 is formed.

Figure 6B:
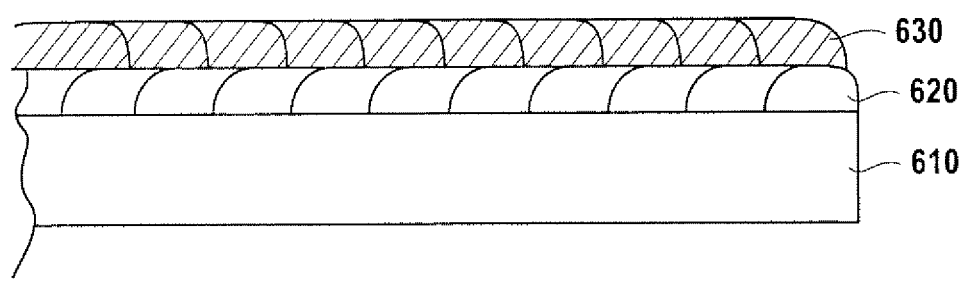
FIG. 6B shows a schematic diagram of a thin film with multiple layers deposited by a proximity head for ALD, in accordance with an embodiment of the current invention.

FIG. 6B shows a schematic cross-sectional diagram of a plurality of thin film layers 620, 630 deposited on a substrate surface. After the first layer 620 is deposited, a second layer 630 is deposited on top of the first layer 620. The second layer 630 can be formed with the same material as the first layer 620 to increase the total thickness of the film. Alternatively, if the thickness of the first layer 620 is sufficient, or has reached the targeted thickness, the second layer 630 can be made of a different material. For example, the material of the first layer 620 can be TaN, which acts as a barrier layer. The material of the second layer 630 can be Ru, which acts as a liner layer.

Figure 7A:
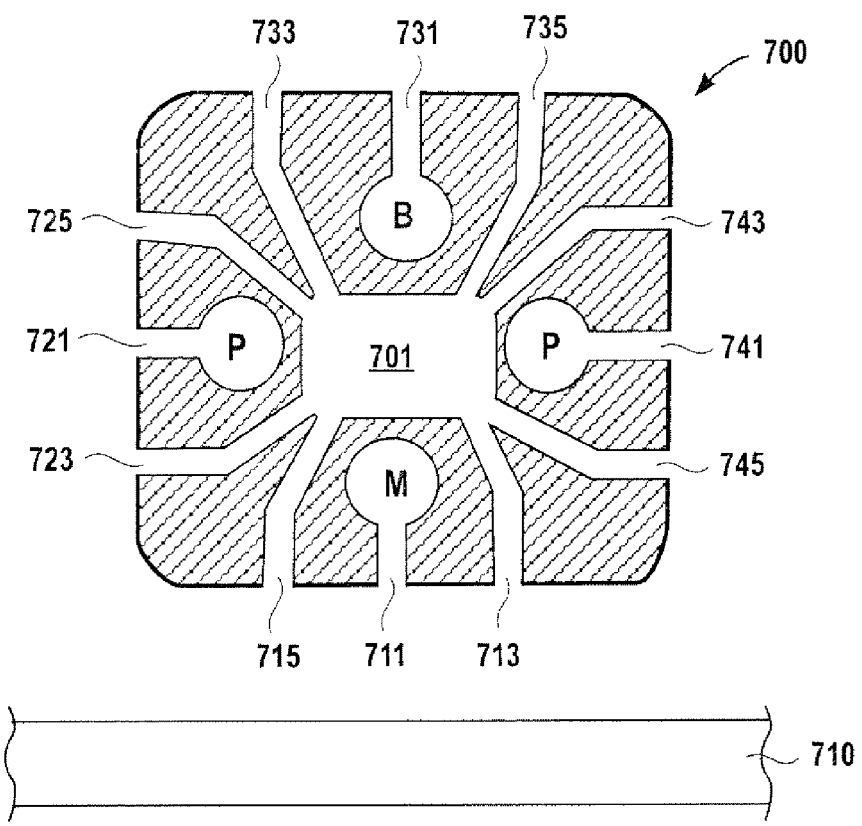
FIG. 7A shows a schematic cross-section of a proximity head, in accordance with an embodiment of the current invention.

In addition to the embodiment of proximity head shown in FIG. 5A, other embodiments are also possible. FIG. 7A shows a cross section of a rotating proximity head 700 suspended above a substrate 710. The cross section of proximity head 700 can be rectangular or square. On the surface of each side, there is a gas inlet in the middle and vacuum channels on both sides of the gas feed. For example, on side 1, there are a gas inlet 711, supplying reactant M, and vacuum channels 713, 715. On side 2, there are a gas inlet 721 supplying purging gas P, and vacuum channels 723, 725. On side 3, there are a gas inlet 731 supplying reactant B, and vacuum channels 733, 735. On side 4, there are a gas inlet 741 supplying purging gas P, and vacuum channels 743, 745. In the embodiment shown in FIG. 7A, the various vacuum channels 713, 715, 723, 725, 733, 735, 743, 745 are connected to one vacuum plenum 701, which is connected to a vacuum pump. In one embodiment, between each of the vacuum channels 713, 715, 723, 725, 733, 735, 743, 745 and the vacuum plenum 701 there is a controlling valve (not shown) that controls that on/off of the vacuum channel.

At the start of the process flow of FIG. 2, side 1 faces the surface of substrate 710. A pulse of reactant M is dispersed on the substrate surface underneath the proximity head. Excess amount of reactant M is pumped away from the substrate surface by vacuum channels 713, 715. Afterwards, the proximity head 700 rotate to have side 2 facing the surface of substrate 710 to pulse the purging gas to expel excess reactant M from the substrate surface. The rotating device is not shown. Side 3 is then rotated to face the surface of substrate 710 to allow a pulse of reactant B to be dispersed on the substrate surface underneath the proximity head. Reactants M and B react to form a barrier layer or a liner layer. At the end of reaction, side 4 is rotated to face the surface of substrate 710 to purge excess reactant B and reaction byproduct from the surface of substrate 710 and finishes one deposition cycle. During the deposition cycle, the distance between various sides to the surface of substrate 710 can be different from one side to the next side. The mechanism (or device) that rotates and moves the proximity head allows gap space to be different from side to side. At the end of one deposition cycle, another cycle can be repeated on the same location to increase the film thickness or the proximity head can be moved to a location next to the current location to deposit another section of the thin film, as shown in FIG. 6A.

The gap distance between the proximity head and substrate is small during ALD cycles. The gap distance between the proximity head and substrate during dispensing of barrier-metal-containing reactant M is less than about 5 mm In one embodiment, the gap distance is about 1 mm The gap distance between the proximity head and substrate during dispensing of reactant B is less than about 5 mm In one embodiment, the gap distance is about 1 mm The gap distance between the proximity head and substrate during dispensing of purging gas is less than about 5 mm In one embodiment, the gap distance is about 1 mm During deposition cycle, the gap distance can change when the proximity head rotates from side to side. For example, the gap distance for pulsing of reactant M or B can be smaller than the gap for purging gas P. The smaller gap distance during pulsing of reactant M or B decreases the reaction volume, while slightly larger gap distance during pulsing of purging gas could enhance the purging efficiency.

It is desirable to have the surfaces of sides 1, 2, 3, 4 around the gas inlets and vacuum channels to be flat to ensure the pulse of reactant M, B, or purging gas P is distributed evenly on the substrate surface. In addition, the vacuum channels suck away the excess reactant M, B or purging gas P evenly across the substrate surface. The flat surfaces of sides 1, 2, 3, 4 ensure uniform film deposition on the surface of substrate 710.

Figure 7B:
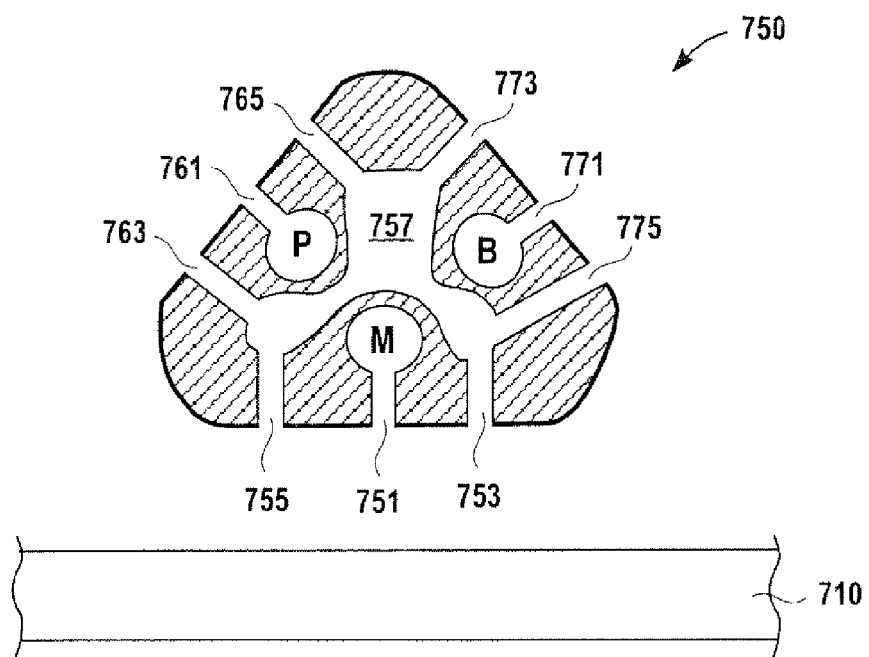
FIG. 7B shows a schematic cross-section of a proximity head, in accordance with another embodiment of the current invention.

In addition to the embodiment shown in FIG. 7A, the proximity head 750 for ALD deposition can include 3 sides, as shown in FIG. 7B. For example, on side 1, there are a gas inlet 751, supplying reactant M, and vacuum channels 753, 755. On side 2, there are a gas inlet 761 supplying purging gas P, and vacuum channels 763, 765. On side 3, there are a gas inlet 771 supplying reactant B, and vacuum channels 773, 775. The vacuum channels are connected to a vacuum plenum 757, which is connected to a vacuum pump. During deposition cycle, the proximity head can rotate from side 1 to side 2 to side 3, and then back to side 2 to complete the deposition cycle.

Figure 7C:
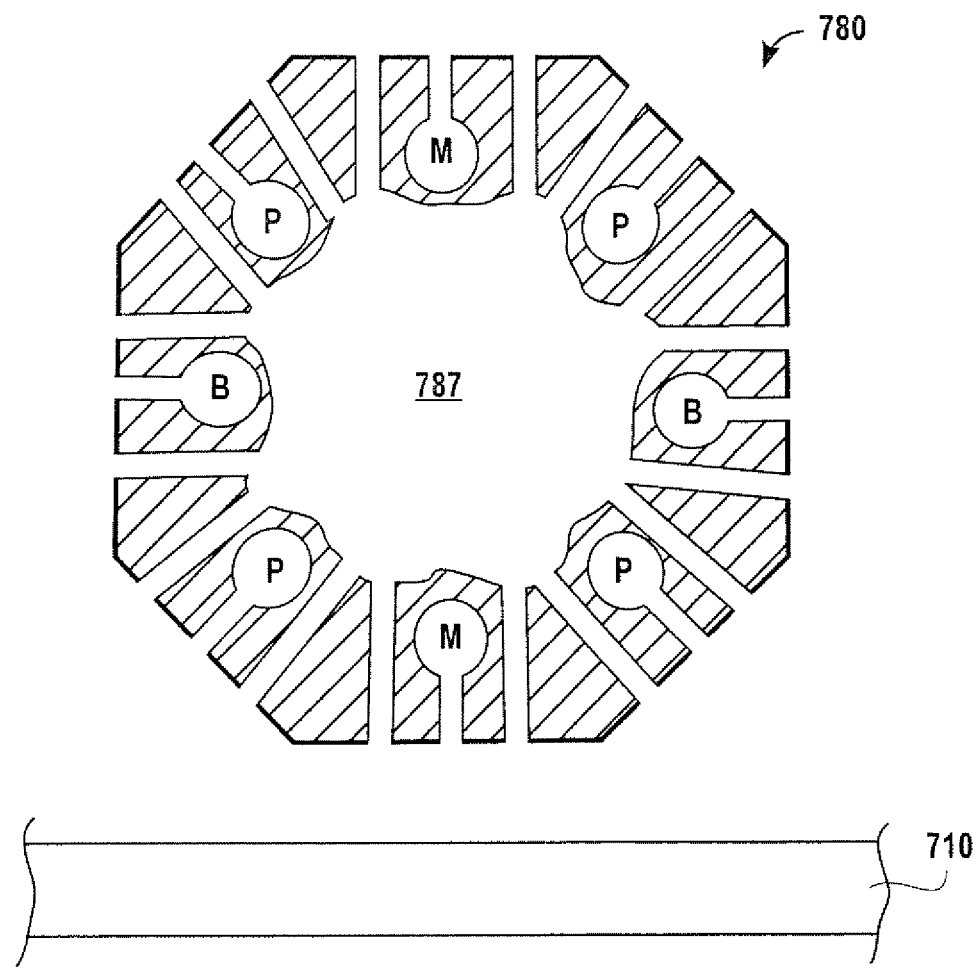
FIG. 7C shows a schematic cross-section of a proximity head, in accordance with yet another embodiment of the current invention.

FIG. 7C shows another embodiment of proximity head 780 for ALD deposition. In this embodiment, there are 8 sides to dispense reactants and purging gas in the order of M-P-B-P-M-P-B-P. At the end of one rotation of the proximity head 780, two deposition cycles are completed. In one embodiment, the proximity head stays at one location to complete the two deposition cycles. In another embodiment, the proximity head 780 moves to the next location at the end of the first deposition cycle and performs the second deposition at the new location to complete a full rotation of the proximity head 780.

Figure 7D:
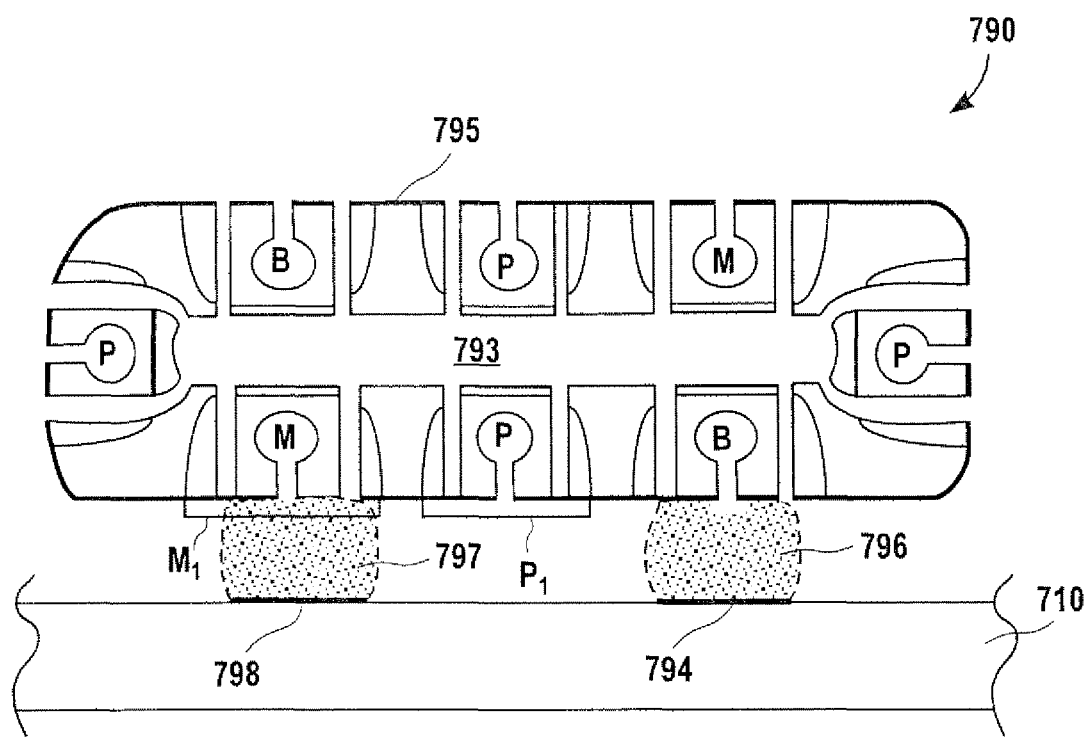
FIG. 7D shows a schematic cross-section of a proximity head with conveyer belt, in accordance with an embodiment of the current invention.

FIG. 7D shows another embodiment of proximity head 790 for ALD deposition. In this embodiment, there are 8 sections of gas inlets with vacuum channels coupled to a conveyer belt 795 to dispense reactants and purging gas in the order of M-P-B-P-M-P-B-P. There is a reaction volume 797 under the conveyer belt. The reaction volume 797 is above substrate surface area 798, and is underneath the section $M_1$, which dispenses reactant M. Afterward the pulse of reactant M is dispensed on the substrate surface, the conveyer belt 795 move the $P_1$ section to be above the substrate surface 798 to dispense purging gas. At the end of one rotation of the proximity head 790, two deposition cycles are completed. In one embodiment, the proximity head 790 stays at one location to complete the two deposition cycles. In another embodiment, the proximity head 790 moves to the next location at the end of the first deposition cycle and performs the second deposition at the new location to complete a full rotation of the proximity head 790. In yet another embodiment, there is another deposition volume 796 underneath the conveyer belt. Film deposition occurs on the surface 794 under the deposition volume 796. In this embodiment, there are two reaction volumes 797, 796 under the conveyer belt. Surface 794 has been exposed to reactant M when the proximity head 790 was at its previous location. This embodiment produces film thickness twice the amount of the embodiment with one single reaction volume.

Figure 8A:
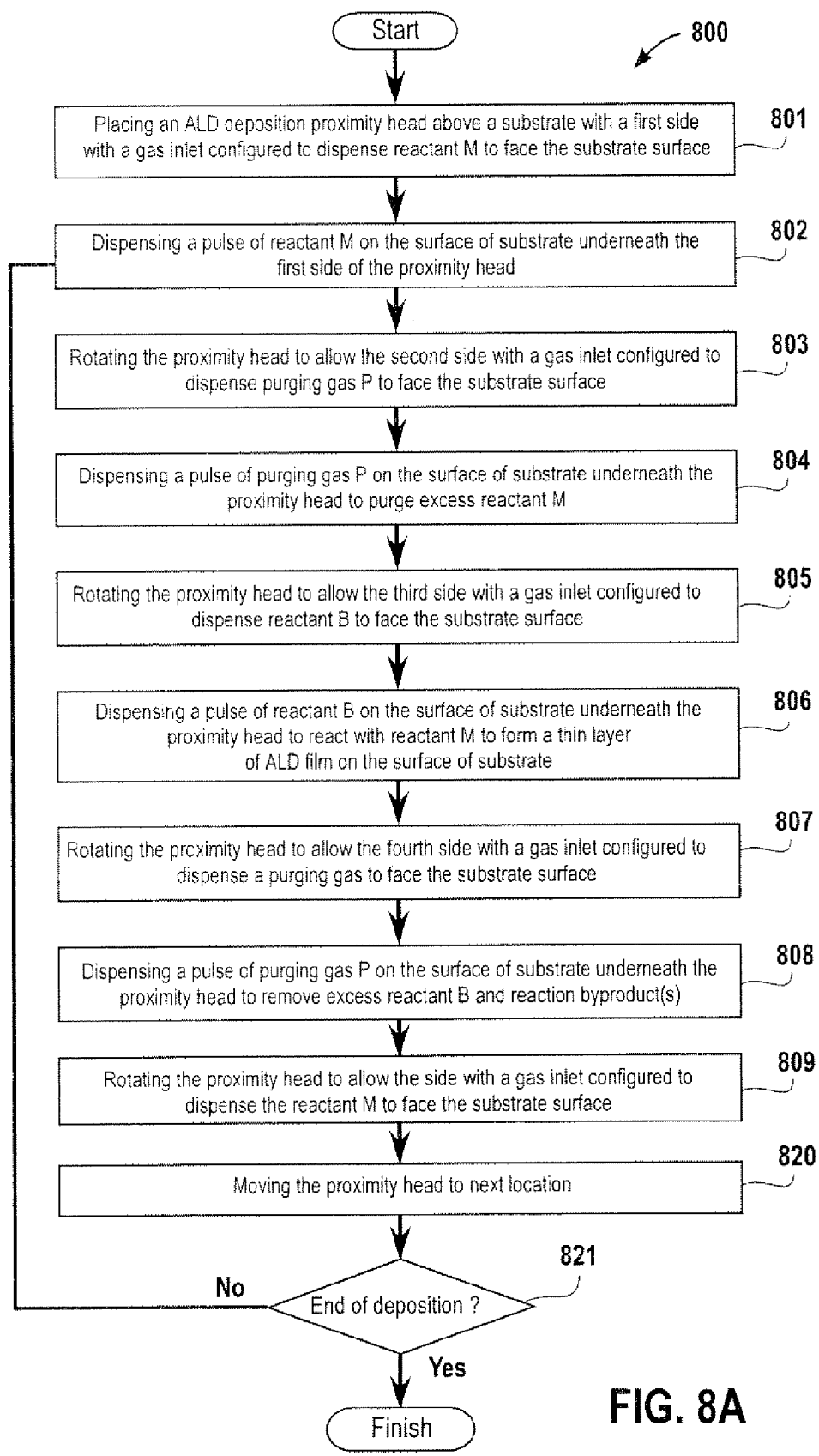
FIG. 8A shows a process flow of ALD using a proximity head, in accordance with an embodiment of the current invention.

FIG. 8A shows an embodiment of a process flow 800 to deposit an ALD layer using a proximity head. The process flow can be used to deposit any type ALD film and is not limited to deposit a metal film, a barrier layer, or a liner layer. In step 801, an ALD deposition proximity head is placed above a substrate with a first side with a gas inlet configured to dispense reactant M to face the substrate surface. In step 802, a pulse of reactant M is dispensed on the surface of substrate underneath the first side of the proximity head. In step 803, the proximity head is rotated to allow the second side with a gas inlet configured to dispense purging gas P to face the substrate surface. In step 804, a pulse of purging gas P is dispensed on the surface of substrate underneath the proximity head to purge excess reactant M from the surface of substrate underneath the proximity head. In step 805, the proximity head is rotated to allow the third side with a gas inlet configured to dispense reactant B to face the substrate surface. In step 806, a pulse of reactant B is dispensed on the surface of substrate underneath the proximity head to react with reactant M to form a thin layer of ALD film on the surface of substrate underneath the proximity head. In step 807, the proximity head is rotated to allow the fourth side with a gas inlet configured to dispense a purging gas to face the substrate surface. In step 808, a pulse of purging gas P is dispensed on the surface of substrate underneath the proximity head to remove excess reactant B and reaction byproduct(s) of the ALD from the surface of substrate underneath the proximity head.

In step 809, the proximity head is rotated to allow the side with a gas inlet configured to dispense the reactant M to face the substrate surface. In step 820, the proximity head is moved to next location. Next location can be a location for deposition or a resting location for the proximity head. In an alternative embodiment, steps 809 and 820 can be switched. In step 821, a decision of whether the end of deposition has been reached is made. If the answer is "yes", the ALD deposition by the proximity head is finished. If the answer is "No", the process returns to step 802 to continue film deposition.

Figure 8B:
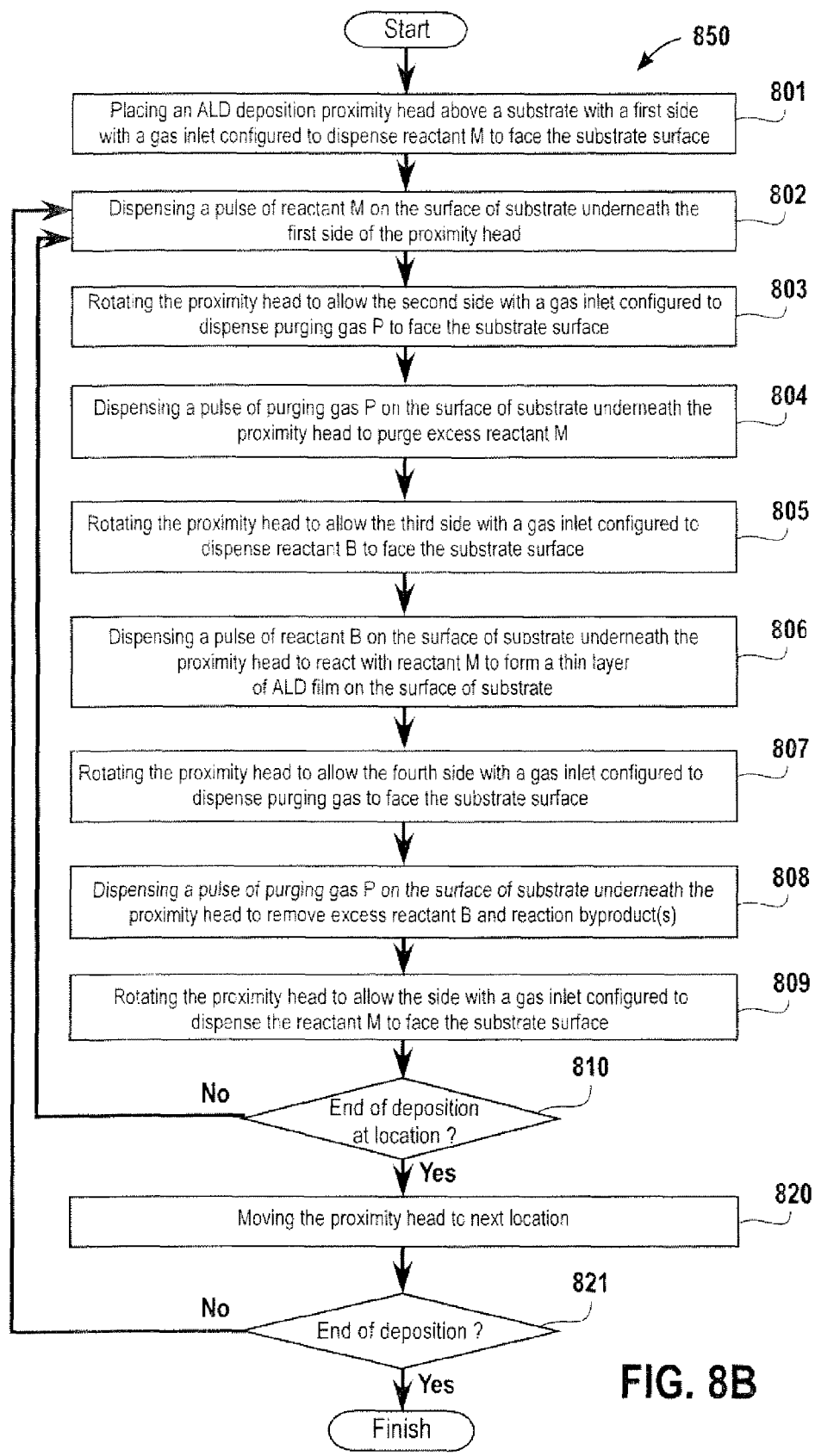
FIG. 8B shows a process flow of ALD using a proximity head, in accordance with another embodiment of the current invention.

In another embodiment, multiple deposition cycles can be performed before the proximity head is moved to the next location. FIG. 8B shows the process flow 850 of this other embodiment of performing multiple deposition cycles before the proximity head is moved to the next location. In this embodiment, a process step 810 is inserted right after step 809. In step 810, a decision of whether the end of deposition cycle at the current location has been reached is made. If the answer is "yes", the process goes to step 820 to move the proximity head to next deposition location. If the answer is "No", the process returns to step 802 to continue film deposition at the current location.

The ALD process using the proximity head to deposit barrier layer, liner layer, or a combination of a barrier layer and a liner layer is conducted in the temperature range between about 150° C. to about 400° C. in one embodiment. In another embodiment, the temperature range is between about 250° C. to about 350° C. The process pressure is between about 10 mTorr to about 10 Torr. Please note that pulse M, pulse B, and pulse P might be under different pressures.

There is a wafer area pressure ($P_{wap}$) in the reaction volume. In one embodiment of ALD, $P_{wap}$ is in the range between about 10 mTorr to about 10 Torr. In another embodiment of ALD, $P_{wap}$ is in the range between about 100 mTorr to about 2 Torr. Wafer area pressure $P_{wap}$ in the reaction volume needs to be greater than chamber pressure ($P_{chamber}$) to control $P_{wap}$. Chamber pressure ($P_{chamber}$) needs to be at least slightly higher than the pressure of the vacuum pump that is used to control the chamber pressure. The vacuuming of reactant M, B and purging gas P can be performed by turbo pump capable of achieving $10^{-6}$ Torr.

In one embodiment, the proximity head, described in FIG. 7A, rotates at speed between about 1 cycle/s (or Hz) to about 100 cycles/s (narrower 10-20 cycles/s). In one cycle, the proximity head rotates one full turn to complete the cycle of dispensing process gas in the sequence of reactant M, purging gas P, reactant B, and purging gas P. Assuming the rotation rate is about 10-20 cycles/s, a 0.4 Å/cycle deposition of barrier or liner layer, such as Ru, will result in deposition rate of about 4-8 Å/s, which is at least 10 times the deposition rate of 0.08-0.4 Å/s generated by conventional ALD process. Throughput can be greatly increased by the proximity head ALD process.

A substrate to be deposited with a barrier layer and/or a liner layer might need to be pre-treated to clean the substrate surface or to prepare the substrate surface for depositing an ALD with better film quality. After barrier/liner layer deposition, the substrate surface also might be post-treatment to clean surface impurity or to prepare the substrate for copper seed layer deposition. Surface treatment can also be performed by a proximity head. Details of using a proximity head for surface treatment are described in U.S. patent application Ser. No. 11/736,514, entitled "Apparatus and Method for Pre and Post Treatment of Atomic Layer Deposition," which is filed on the same day as the instant application. This application is incorporated herein by reference in its entirety.

Figure 9:
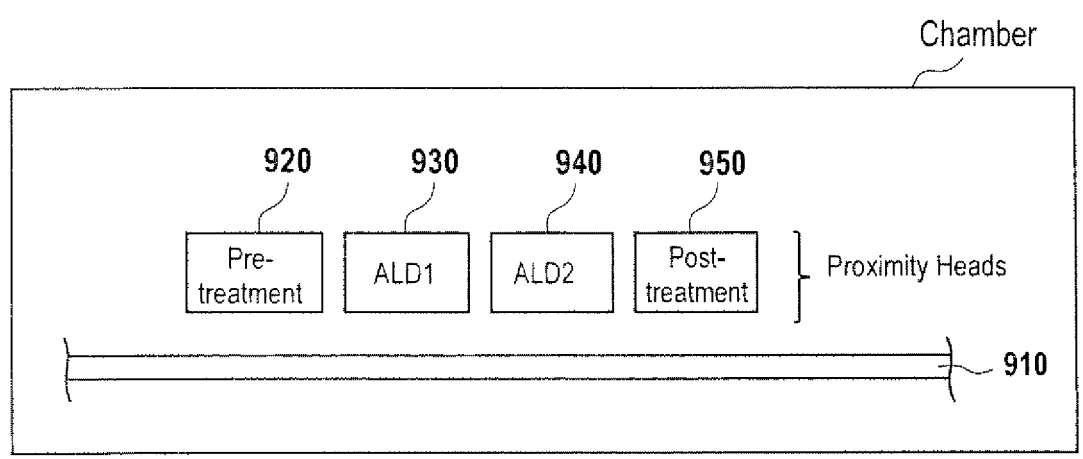
FIG. 9 shows a plurality of proximity heads for surface treatment and deposition over a substrate, in accordance with an embodiment of the current invention.

ALD proximity head, pre-treatment proximity head, and/or post-treatment proximity head can be integrated in one single process chamber to complete the deposition and treatment processes. For a substrate to be deposited with a thin barrier layer, such as TaN, and a liner layer, such as Ru, the substrate can be pre-treated to clean the substrate surface or the substrate surface can be pre-treated to prepare the surface for ALD deposition, as discussed above. After the liner layer deposition, the substrate surface can be post-treated to prepare the surface for copper seed layer deposition. In a single and integrated deposition/treatment chamber, the substrate is pre-treated, deposited with a barrier layer and a liner layer, and post-treated. FIG. 9 shows a substrate 910 with a plurality of proximity treatment and deposition heads over the substrate 910. Pre-treatment proximity head 920 is used to pre-treat the substrate surface either to remove impurities or to prepare the substrate surface for ALD. Next to pre-treatment proximity head 920 is an ALD1 proximity head 930 used to deposit a barrier layer on the substrate. After the ALD1 proximity head 930 is an ALD2 proximity head 940 used to deposit a liner layer on the substrate. After the liner layer is deposited, the substrate is post-treated either to remove impurities or to prepare the substrate surface for copper seed layer deposition following. The post-treatment is performed by a post-treatment proximity head 950. The various proximity heads move sequentially across the substrate surface to complete treatment and deposition surface. The treatment and deposition processes can occur simultaneously or in sequence. The embodiment shown in FIG. 9 is only an example of integrating treatment proximity head with deposition proximity head. Other combinations are possible.

The ALD chamber with the proximity head can be integrated with other deposition, substrate cleaning, or pre-treatment system(s) to complete copper interconnect deposition. Details of integrating an ALD chamber using a proximity head for ALD with other deposition and treatment modules are described in commonly assigned U.S. patent application Ser. No. 11/736,522, entitled "Apparatus and Method for Integrated Surface Treatment and Deposition for Copper Interconnect," which is filed on the same day as the instant application. This application is incorporated herein by reference in its entirety.

The ALD chamber with the proximity head also can be integrated with another proximity head for ALD or CVD, and proximity heads for pre-treatment and post-treatment in the same ALD deposition chamber to complete the barrier/liner layer deposition. Details of an integrated ALD chamber for deposition a barrier and/or liner layer are described in commonly assigned U.S. patent application Ser. No. 11/736,519, entitled "Apparatus and Method for Integrated Surface Treatment and Film Deposition," which is filed on the same day as the instant application. The application is incorporated herein by reference in its entirety.

The proximity head ALD chamber described can be used to deposit any type of ALD film and is not limited to conductive metal films. Dielectric films or semi-conductive films can also be deposited in ALD chambers using proximity heads to perform film deposition.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention. In the claims, elements and/or steps do not imply any particular order of operation, unless explicitly stated in the claims.

What is claimed is:

1. A method of depositing a thin film by atomic layer deposition (ALD) on a substrate surface of a substrate, comprising:
    placing an ALD deposition proximity head above the substrate with at least one gas channel configured to dispense a gas to an active process region of the substrate surface, wherein the ALD deposition proximity head covers the active process region of the substrate surface, wherein the active process region covered is less than a complete area of a top surface of the substrate;
    dispensing a pulse of a first reactant gas on the active process region of the substrate surface underneath the proximity head;
    dispensing a first pulse of purging gas on the active process region of the substrate surface underneath the proximity head to purge excess first reactant gas from a reaction volume between the ALD proximity head and the substrate surface;
    dispensing a pulse of a second reactant gas on the active process region of the substrate surface underneath the proximity head to react with the first reactant gas to form a portion of the thin film on the surface of substrate underneath the proximity head; and
    dispensing a second pulse of purging gas on the active process region of the substrate surface underneath the proximity head to remove excess second reactant gas and reaction by product(s) from the reaction volume between the ALD proximity head and the substrate surface; and
    moving the ALD deposition proximity head to a new active process region, the moving configured to repeat to other new active process regions until the complete area of the top surface of the substrate receives the thin film.

2. The method of claim 1, wherein the ALD deposition proximity head includes a plurality of sides, each side being configured to dispense either the first reactant gas, the second reactant gas or the purging gas on the active process region of the substrate surface underneath the proximity head, each side having at least one vacuum channel, and the ALD deposition proximity head rotating from side to side to complete at least one deposition cycle for ALD.

3. The method of claim 1, wherein the ALD deposition proximity head includes at least one vacuum channel next to at least one gas channel used to dispense either the first reactant gas, the second reactant gas, or the purging gas, the at least one vacuum channel assisting in removing excess reactants, purging gas, or deposition byproducts from the substrate surface.

4. The method of claim 3, wherein the ALD deposition proximity head rotates from side to side to complete at least one deposition cycle for ALD.

5. The method of claim 4, wherein the ALD deposition proximity head rotates at a speed between about 1 cycle/s to about 100 cycles/s.

6. The method of claim 1, wherein the dispensed reactant gas or purging gas is used to form a plasma.

7. The method of claim 1, wherein the thin film deposited by ALD is a barrier layer or a liner layer, the metal in the film being selected from the group consisting of tantalum (Ta), titanium (Ti), tungsten (W), zirconium (Zr), hafnium (HO, molybdenum (Mo), niobium (Nb), vanadium (V), ruthenium (Ru) and chromium (Cr).

8. A method of depositing a thin film by atomic layer deposition (ALD) on a substrate surface of a substrate, comprising:
    placing an ALD deposition proximity head above the substrate with at least one gas channel configured to dispense a gas to an active process region of the substrate surface, wherein the ALD deposition proximity head extends over and is spaced apart from the active process region of the substrate surface when present, the active process region being less than an entire top surface of the substrate;
    dispensing a pulse of a first reactant gas on the active process region of the substrate surface underneath the proximity head;
    dispensing a pulse of a second reactant gas on the active process region of the substrate surface underneath the proximity head to react with the first reactant gas to form a portion of the thin film on the surface of substrate underneath the proximity head;
    moving the ALD deposition proximity head over additional active process regions until the thin film is formed over the entire top surface of the substrate.

9. The method of claim 8, wherein the proximity head further includes at least one vacuum channel next to the at least one gas channel.

10. The method of claim 9, further comprising:
    removing excess first reactant gas by the at least one vacuum channel after dispensing the pulse of the first reactant gas.

11. The method of claim 9, further comprising:
    removing excess second reactant gas and reaction byproduct(s) by the at least one vacuum channel after dispensing the pulse of the second reactant gas.

* * * * *